United States Patent
Huang et al.

(10) Patent No.: US 9,627,234 B2
(45) Date of Patent: Apr. 18, 2017

(54) METHOD AND APPARATUS FOR LOCALIZED AND CONTROLLED REMOVAL OF MATERIAL FROM A SUBSTRATE

(71) Applicant: Taiwan Semiconductor Manufacturing Company, Ltd., Hsin-Chu (TW)

(72) Inventors: Hui-Min Huang, Taoyuan County (TW); Chih-Wei Lin, Hsinchu County (TW); Cheng-Ting Chen, Taichung (TW); Ming-Da Cheng, Hsinchu Country (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/208,124

(22) Filed: Mar. 13, 2014

(65) Prior Publication Data

US 2014/0273499 A1 Sep. 18, 2014

Related U.S. Application Data

(60) Provisional application No. 61/781,710, filed on Mar. 14, 2013.

(51) Int. Cl.
*H01L 21/67* (2006.01)
*H01L 21/02* (2006.01)
*G03F 7/42* (2006.01)

(52) U.S. Cl.
CPC .......... *H01L 21/6708* (2013.01); *G03F 7/42* (2013.01); *H01L 21/02052* (2013.01); *H01L 21/02057* (2013.01)

(58) Field of Classification Search
CPC .......... H01L 21/6708; H01L 21/32134; H01L 21/67051; H01L 21/02052; H01L 21/6715
See application file for complete search history.

(56) References Cited

U.S. PATENT DOCUMENTS

| | | | | |
|---|---|---|---|---|
| 6,103,636 A | * | 8/2000 | Zahorik et al. | 438/745 |
| 6,723,626 B2 | * | 4/2004 | Tsuchiya et al. | 438/597 |
| 6,743,722 B2 | * | 6/2004 | Kassir | 438/690 |
| 8,105,954 B2 | | 1/2012 | Wang et al. | |
| 2003/0143861 A1 | | 7/2003 | Kassir | |
| 2012/0108040 A1 | | 5/2012 | Chang et al. | |
| 2013/0109140 A1 | * | 5/2013 | Chou et al. | 438/197 |

OTHER PUBLICATIONS

Chinese office action issued in Patent Application No. 201410095988.4 on Apr. 1, 2016.

* cited by examiner

*Primary Examiner* — Duy Deo
(74) *Attorney, Agent, or Firm* — Haynes and Boone, LLP

(57) ABSTRACT

A method and a system that include providing a localized dispensing apparatus. A substrate having a material disposed on its top surface is oriented above the localized dispensing apparatus. A chemical is then dispensed from the localized dispensing apparatus onto the top surface of the oriented substrate. The chemical removes the material. The path for the material removal may be determined and the localized dispensing apparatus programmed to provide chemical according to the path.

20 Claims, 8 Drawing Sheets

METHOD AND APPARATUS FOR LOCALIZED AND CONTROLLED REMOVAL OF MATERIAL FROM A SUBSTRATE

This application claims priority to U.S. Provisional Patent Application Ser. No. 61/781,710, filed on Mar. 14, 2013, and entitled "Method And Apparatus For Localized And Controlled Removal Of Material From A Substrate," the entire disclosure of which is hereby incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process provides benefits by increasing production efficiency and lowering associated costs. However, it has also increased the complexity of processing and manufacturing ICs, and, for these advances to be realized, similar developments in IC manufacturing are needed.

Semiconductor devices are fabricated by creating a sequence of patterned layers defining semiconductor device features. Lithographic techniques are critical to providing these features and thus to semiconductor manufacturing generally. In a typical lithography process, a photosensitive layer (resist) is applied to a surface of a semiconductor substrate, and an image of features defining parts of the semiconductor device is provided on the layer by exposing the layer to a pattern of radiation. The photosensitive layer is then stripped from the substrate. Currently employed processes such as application of stripping by spray/spin on methods and/or batch methods can be insufficient in some ways. For example, as semiconductor processes evolve to provide for smaller critical dimensions, and devices reduce in size and increase in complexity leading to high aspect ratio features, it is difficult to strip all residue of the photosensitive material from such high-aspect ratio features. As another example, the stripping solution contacts each and every portion of the substrate during the typical processes and thus can attack or damage other features disposed on the substrate. Thus, while the present methods for stripping a material such as a photosensitive material from a substrate may be suitable in some respects, improvements may be desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
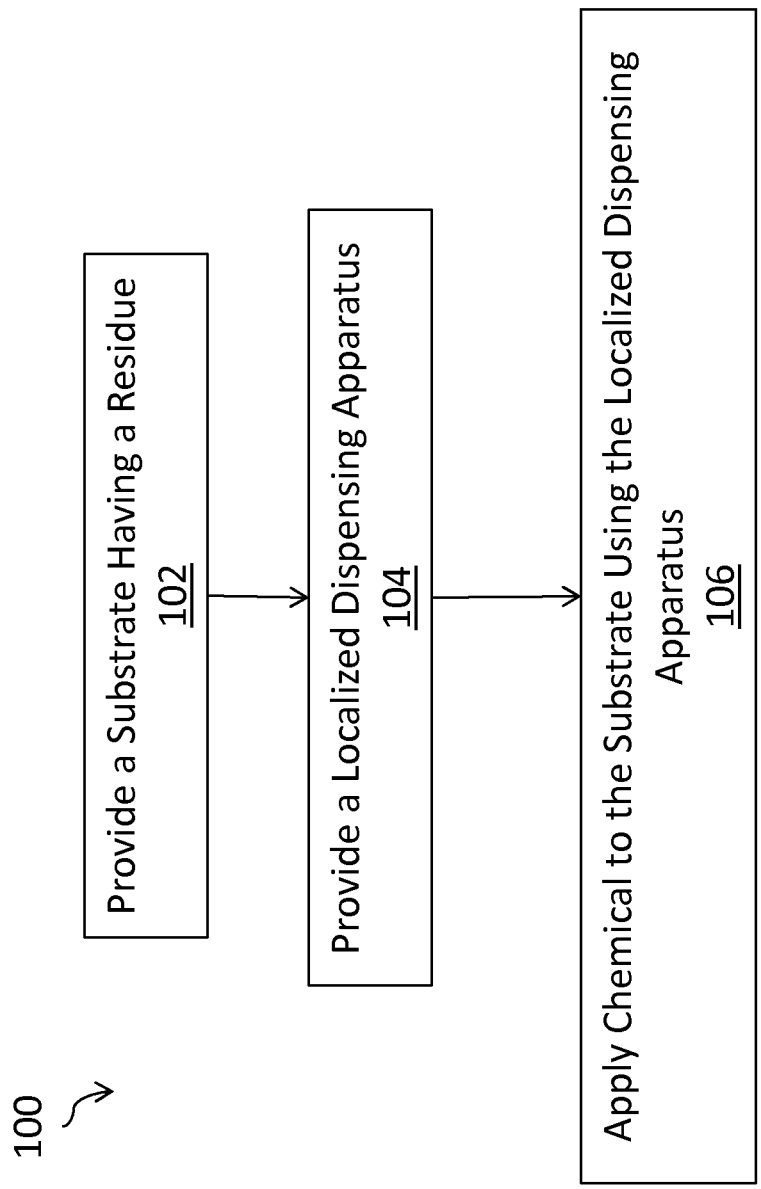
FIG. 1 is a flow chart of an embodiment of removing a material from a substrate using one or more aspects of the present disclosure.

Illustrated in FIG. 1 is a flow chart of a method 100 of removing material from a substrate. In an embodiment, the material removed may be a photosensitive material, removed, for example, after patterning of the material. The removal of the material may also be referred to as stripping.

The method 100 may be used to fabricate a semiconductor device including, for example, an intermediate device formed during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. Various steps discussed with reference to the method 100, like the other methods and apparatus described herein, include features of a complementary metal-oxide-semiconductor (CMOS) technology process flow and thus, are only described briefly herein. In other embodiments, the method 100 may be used to fabricate a photomask, such as used in lithography processes forming semiconductor devices, to fabricate mechanical-electrical machine (MEMS) devices, TFT-LCD devices, modules includes semiconductor devices, and/or other suitable devices.

Furthermore, additional steps may be performed before, after, and/or during the method 100. Similarly, while various portions of this disclosure include embodiment directed to removal of certain material types or feature types, one may recognize other portions of a device and/or fabrication flow that may benefit from the removal methods described herein.

The method 100 begins at block 102 where a substrate is provided. The substrate has a material such as a formed layer or a residue that it is desired to remove from the substrate. In an embodiment, the material desired to be removed is a photosensitive material also referred to as a photoresist.

The substrate may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. One or more layers or features (e.g., doped regions or wells, isolation features, trenches, and the like) may be formed on the substrate. In other embodiments, the substrate may be a substrate used to form a photomask (e.g., quartz substrate), a substrate of a module device, a substrate of a MEMs device, and/or various other devices such as semiconductor devices formed using sacrificial photosensitive material.

In an embodiment, features having a tight aspect ratio are disposed on the substrate and a material is desired to be removed from the features or the space interposing those features. For example, in an embodiment, a plurality of line features is disposed on the substrate and it desired to remove a material from between the line features. In another embodiment, a plurality of trench features is disposed on the substrate and it desired to remove a material from the bottom and/or sidewalls of the trenches.

Figure 2:
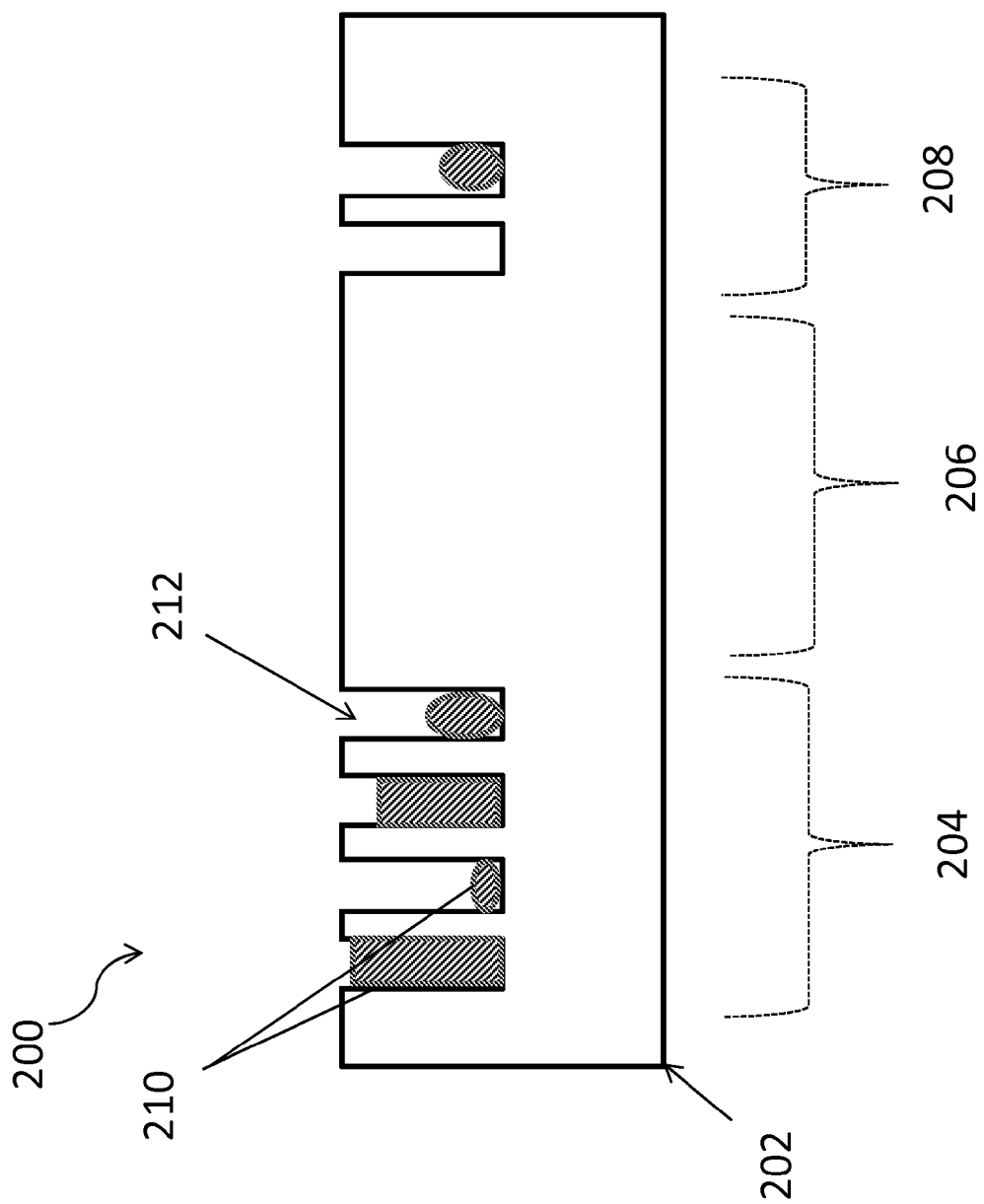
FIG. 2 is a diagrammatic cross-sectional view of an exemplary substrate that may be used in the method 100.

Referring to the example of FIG. 2, illustrated is a device 200 having a substrate 202. A plurality of features 212 is disposed on the substrate. In the illustrated embodiment, the plurality of features 212 are trenches disposed in the substrate 202. However, other features may be possible in lieu of or in addition to the features 212. A material 210 is disposed in the features 212. As described below, it may be desired to remove the material 210 in whole or in part from the substrate 202.

The substrate 202 may include a silicon substrate. Alternatively, the substrate 202 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet other embodiments, the substrate 202 may be a substrate used in the formation of a photomask. For example the substrate 202 may be quartz. However, the present disclosure is not limited to a specific type of substrate beyond what is defined explicitly in the claims below.

In an embodiment, the material 210 is a residue remaining after a first process has been performed to remove a layer including the material 210 from the substrate 202. For example, the material 210 may be disposed in trench features 212 and thus, difficult to remove from the substrate. In another embodiment, the material 210 may be a portion of a layer for which no previous removal process has been performed. As illustrated, the configuration of material 210 is exemplary only and not intended to be limiting the quantity or configuration of the material 210. For example, in some embodiments, the material 210 fills each of the trenches 212.

In an embodiment, the material 210 is a photosensitive material, also referred to as photoresist. The material 210 may be a photoresist residue remaining on the substrate 202 after a first stripping process. In another embodiment, the material 210 is a photoresist material having been used as a masking element to pattern one or more layers on the substrate 202. In a further embodiment, no stripping process has yet been performed on the material 210. For example, the material 210 may substantially fill the features 212.

The substrate 202 as illustrated includes three regions: 204, 206, and 208. Two of the regions 204 and 208 include material 210 that it is to be removed. A third region 206 does not include the material 210. The location of the material 210 may be determined by the design of semiconductor device or IC formed on the substrate 202 or be a byproduct of a fabrication process. While the device 200 illustrates three regions 204, 206, and 208, this is provided for simplification and ease of understanding and does not necessarily limit the embodiment to any number regions, any configuration of patterns, or the like.

It is noted that the semiconductor device 200 may include various other devices and features, formed or partially formed, such as transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected.

The method 100 then proceeds to block 104 where a localized dispensing apparatus is provided. A localized dispensing apparatus is an apparatus that is operable to provide a stream (also referred to as a spray) of fluid to a substrate in a localized region of the substrate (i.e., less than a blanket application).

The localized dispensing apparatus may be a controllable dispensing apparatus. For example, the localized dispensing apparatus may be coupled to an information handling system or controller (controller module) such as described below with reference to FIG. 7 to provide such functionality. In an embodiment, the apparatus may be programmable to deliver a stream of chemical at a predetermined location or a plurality of predetermined locations on the substrate. In an embodiment, the apparatus is programmable such that the chemical is incident certain regions of the substrate, while not incident other regions on the substrate. The determined plurality of regions of the substrate where a chemical is to be incident may be referred to as a dispensing path. The regions requiring chemical or dispensing path may be determined by user input, design data, fabrication data, and/or other suitable means. Using the exemplary embodiment of FIG. 2, the dispensing path for substrate 202 may include regions 204 and 208, and not include region 206.

Figure 3:
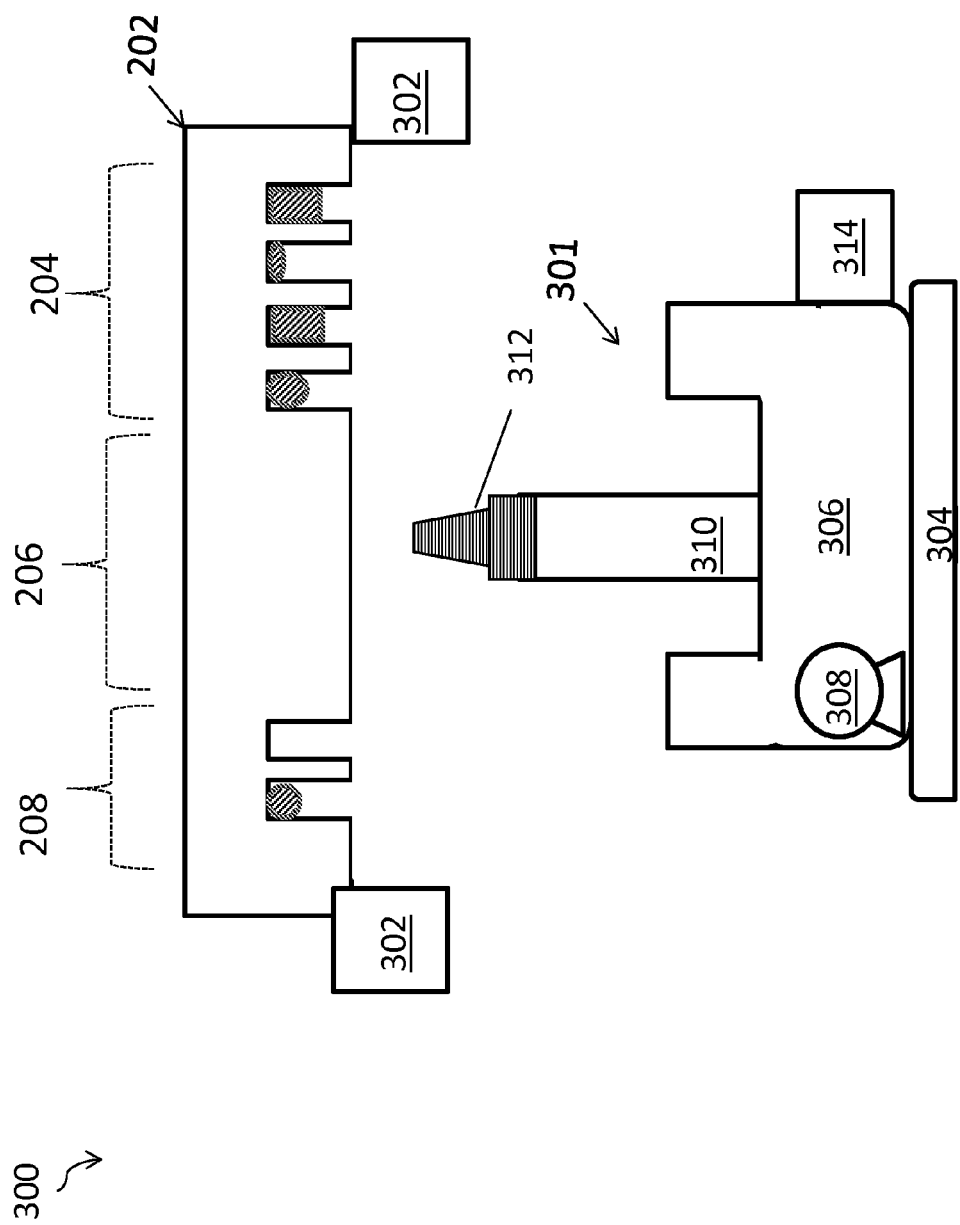
FIGS. 3, 4, and 5 illustrate exemplary embodiments of a localized dispensing apparatus operable to perform localized material removal from a substrate such as that of FIG. 2 according to one or more aspects of the present disclosure.

FIG. 3 is illustrative of an embodiment of a system 300 including a localized dispensing apparatus 301 such as may be provided in block 104 of the method 100. The system 300 includes a wafer chuck or stage 302 that is operable to hold a substrate such as the substrate 202. In an embodiment, the wafer chuck 302 is operable to hold a semiconductor wafer. As illustrated, the wafer chuck 302 can hold the substrate 202 in an inverted position such that the material 210, which is desired to be removed from the substrate 202, faces downward. The wafer chuck 302 may be operable to move, rotate, and/or tilt the substrate 202.

The system 300 includes the localized dispensing apparatus 301. The localized dispensing apparatus 301 includes a tank 306. The tank 306 may be operable to hold one or more chemical solutions and/or water. The tank 306 may include a recycling system operable to clean and/or modify a fluid. The localized dispensing apparatus 301 also includes a pump 308. The pump 308 may be located adjacent to, in or otherwise connected to the tank 306. The tank 306 may be positioned on a stage 304. The stage 304 may be operable to move the tank (and/or conduit 310, described below) to be aligned under different positions of the substrate 202.

The localized dispensing apparatus 301 also includes a heater 314. The heater 314 may be operable to heat chemical disposed in the tank 306. Alternatively, the heater 314 may be operable to heat chemical disposed in the conduit 310.

Like the other components of the localized dispensing apparatus 301, the heater 314 is not limited to its illustrated position in FIG. 3.

Extending from the tank 306 is a conduit 310. The conduit 310 may also be referred to as a pipe or tube. In an embodiment, a plurality of conduits 310 is provided extending from the tank 306. The conduit 310 may be circular, rectangular, square, and/or other defined shape. In an embodiment, the conduit 310 is a rectangular shape less than the diameter of the substrate 202. At a terminal end of the conduit 310, there is a nozzle 312. In an embodiment, a plurality of nozzles 312 is disposed on the end of a single conduit 310. The nozzle 312 may be operable to define the size, shape, quantity, angle, and/or other feature of a fluid exiting the conduit 310. In an embodiment, an outer dimension of one or more of the nozzles may range from about 0.1 mm to about 50 mm. In other embodiments, the terminal end of the conduit 310 may not include a nozzle.

The system 300 may include a controller module. The controller module may be operable to program the system 300 such that the localized dispensing apparatus 301 delivers a chemical to different regions of the substrate 202, such as regions 204 and 208, while not delivering chemical to other regions of the substrate 202, such as region 206. The controller module may be operable coupled to the wafer chuck 302 and/or the stage 304 to provide the desired movement or dispensing path. The controller module may also be operable to program the heater 314, the pump 308, the nozzle 312, a recycling system of the tank 306, and/or other suitable features of the localized dispensing apparatus 301. The controller may be substantially similar to the information handling system 704, described below with reference to FIG. 7.

Referring again to FIG. 1, the method 100 then proceeds to block 106 where a chemical is applied to the substrate using the localized dispensing apparatus. In an embodiment, the localized dispensing apparatus provides a stream of solvent. The solvent may be operable to dissolve and/or otherwise remove the material described above in block 102 from the substrate 202. In an embodiment, the solvent is capable of stripping a photoresist material from the substrate. Exemplary solvents include, but are not limited to, acetone, NMP (1-methyl-2-pyrrolidon), DMSO (dimethyl sulfoxide), sulfolane, dimethylformadide (DFM), dimethylacetamide (DMAC), 2,(-2 aminoethoxy)ethanol, alkaline solutions, photoresist developer solutions, other amine-solvent mixtures, organic solvents, proprietary and commercially available stripping solutions such as, for example, Eastman Eastapure TM DE solvent (from Eastmann Chemical Company www.eastman.com), Posistrip (from DuPont, www.dupont.com), and/or other resist strippers now known or later developed. In an embodiment, the localized dispensing apparatus is also operable to provide a water rinse in substantially the same manner as described herein with respect to applying a chemical.

Figure 4:
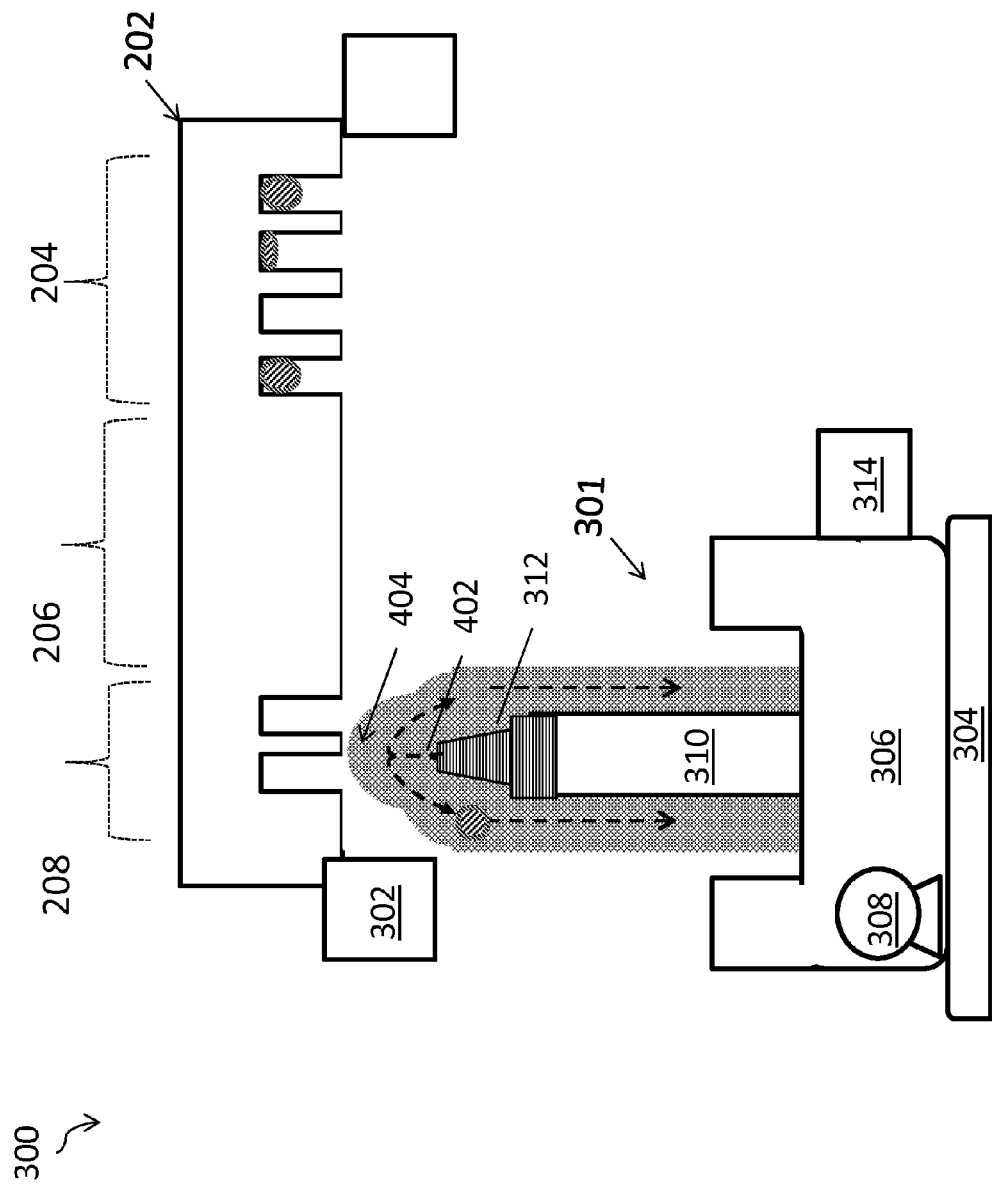

Referring to the example of FIG. 4, illustrated is the system 300 having a chemical 402 applied to the substrate 202 using the localized dispensing apparatus 301. The chemical 402 may be a solvent such as those discussed above. The chemical 402 is delivered up the conduit 310 out the nozzle 312 using a positive pressure. The positive pressure may be applied by the pump 308. The exiting chemical 402 forms a chemical tip 404. The chemical tip 404 is chemical (solvent) that will be incident the substrate 202. When the solvent 402 contacts the material 210 it will dissolve and/or force the removal of the material 210 from the features 212 and the substrate 202, such as illustrated by the material 210 particle in the returning chemical 402. The returning chemical 402 is brought back to the tank 306. In an embodiment, the returning chemical 402 may be recycled and reused in the system 300.

Figure 5:
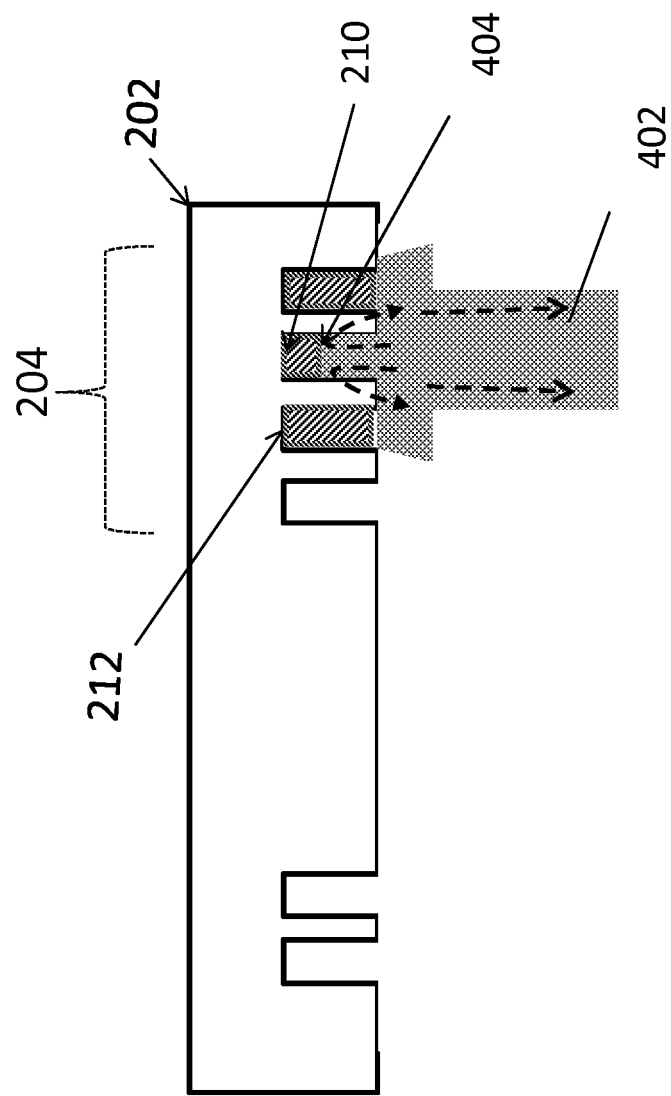

The positive direction of the supply of chemical allows for the material to be removed from a feature such as a trench. For example, the chemical may be continuously applied to deeper and deeper depths of the trench as material embedded in the trench is removed and the positive flow of chemical continues. This is illustrated in FIG. 5, which shows a more detailed cross-sectional view of the chemical tip 404 entering the feature (e.g., trench) 212 and contacting the material 210. As the material 210 is dissolved, the chemical tip 404 extends further into the feature (e.g., trench 212). This may continue until the trench is cleared of substantially all materials 210 from the sidewalls as well as the bottom.

Thus, embodiments of the method 100 and the system 300 may provide for benefits such as reduction in use of chemical by the localized provision of chemical. As the areas of the substrate where the chemical is incident may be controlled or otherwise limited, embodiments of the present disclosure may serve to reduce the exposure and damage to other regions of the substrate from the provision of chemical, where chemical is not desired or needed in those regions. Similarly, this localized delivery may in some embodiments also serve to reduce process steps of a fabrication process as additional masking steps are not required to protect regions of the substrate.

Figure 6:
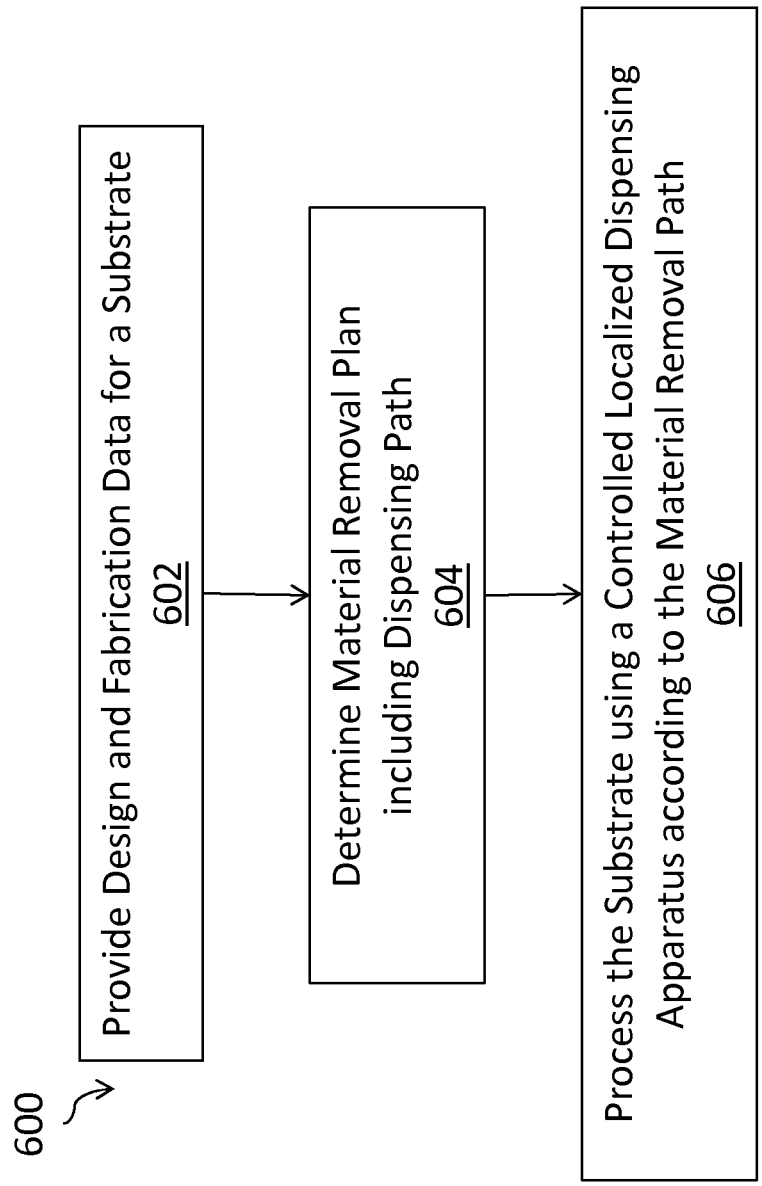
FIG. 6 is a flow chart of another embodiment of a method of removing a material from a substrate according to one or more aspects of the present disclosure.

Referring to the example of FIG. 6, a method 600 is illustrated that provides for removing a material from a substrate. The method 600 may be performed separately from the method 100, or be performed integrated with the method 100 to remove a material from a substrate.

The method 600 begins at block 602 where fabrication and/or design data associated with a substrate is provided. The design and/or fabrication data may define features to be formed on a substrate. The design data may include layout data illustrating one or more layers of a device to be formed on the substrate. The fabrication data may include data directed to identification of processes that provide a material residue. In an embodiment, the provided data is operable to identify that there is material or will be material at certain regions of a substrate that is desired to be removed. The data may identify a photoresist layer such as masking element used in a previous process step, a residue of a material previously removed from a substrate, a material desired to be removed from one or more high-aspect ratio features, and/or other identified locations desiring removal of a material.

The method 600 then proceeds to block 604 where a material removal plan is determined. The material removal plan includes a dispensing path, which defines the regions of substrate where a chemical is to be incident, while defining other regions of the substrate where no chemical is required. Thus, in an embodiment, the dispensing path includes a plurality of coordinates or regions on the substrate, while it does not include other coordinates or regions of the substrate.

Figure 8:
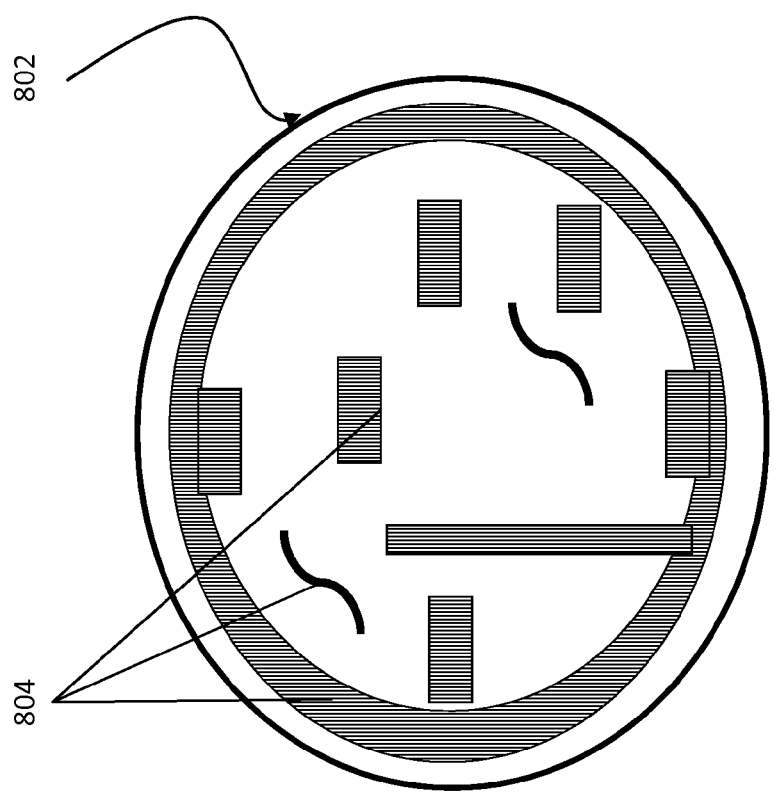
FIG. 8 is a top view of an embodiment of an identification of target material removal regions on a substrate.

Referring to the example of FIG. 8, illustrated is a representation 802 of a substrate. The representation 802 may be of a substrate substantially similar to the substrate 202, described above with reference to FIGS. 1, 2, 3, 4, and 5. The representation 802 includes a plurality of locations 804 identified for removal of a material. In an embodiment, the locations include points on the wafer identified to have a photoresist material or residue thereof that is desired to be removed or stripped. It is noted that the locations 804 are provided for explanatory purposes only and are not intended to be limiting. The locations 804 may be of any quantity, any shape, any size, and located at any position on the substrate.

Thus, the material removal plan may include an identification of the locations desired for chemical to be incident, referred to herein as a dispensing path. For example, in an embodiment, the dispensing path includes a definition of a route or ordering of coordinates on a substrate that the chemical will be dispensed. In a further embodiment, this includes defining the movements of one of the stage (operable to move a conduit supplying the chemical from a localized dispensing apparatus) and/or a substrate chuck of a system that includes a localized dispensing apparatus.

In an embodiment, the material removal plan further includes other parameters such as, for example, a temperature (or heating) of the chemical to be dispensed, an angle of the dispensing (e.g., from a nozzle), a definition of which of a plurality of nozzles and/or conduits of a localized dispensing apparatus are to be used to deliver the chemical, a type of chemical to be delivered by the localized dispensing apparatus, and/or other suitable parameters.

Figure 7:
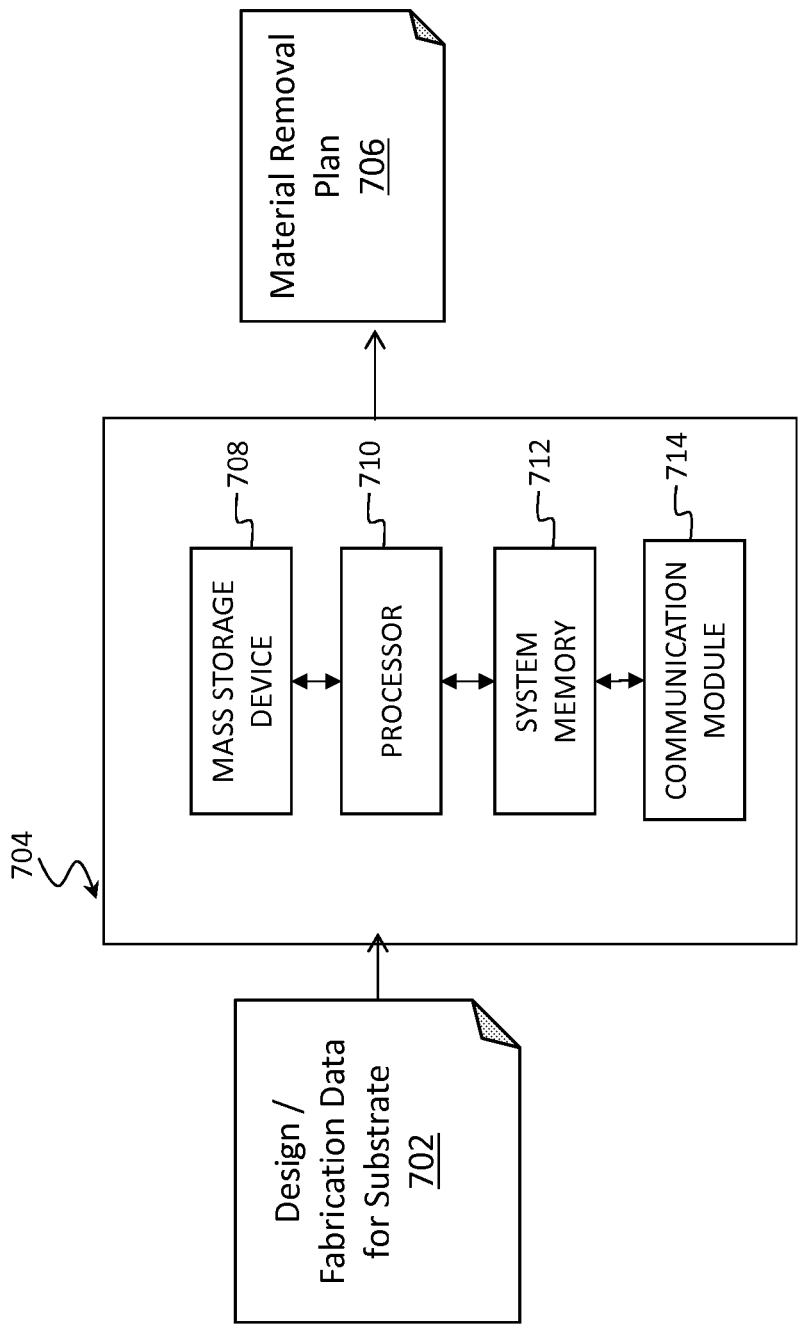
FIG. 7 is a block diagram of an embodiment of a system for determining a material removal plan according to one or more aspects of the present disclosure.

The material removal plan including the dispensing path may be determined by an information handling system such as that described in FIG. 7. In FIG. 7, a system 700 is illustrated that includes design and/or fabrication data 702 being provided to a dispensing plan control module 704. The dispensing plan control module 704 provides material removal plan 706. The material removal plan 706 includes a dispensing path. The material removal plan 706 may be communicated to a localized dispensing system such as described above with reference to FIG. 3 and as further described with reference to the method 600.

The dispensing plan control module 704 is operable to perform the functionality described in association block 604 of the method 600. The dispensing plan control module 704 is an information handling system such as a computer, server, workstation, or other suitable device. The module 704 includes a processor 710 that is communicatively coupled to a system memory 712, a mass storage device 708, and a communication module 714. The system memory 712 provides the processor 710 with non-transitory, computer-readable storage to facilitate execution of computer instructions by the processor. Examples of system memory 712 may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 708. Examples of mass storage devices 708 may include hard discs, optical disks, magneto-optical discs, solid-state storage devices, and/or a variety other mass storage devices known in the art. The communication module 714 is operable to communicate information such as dispensing paths with the other components in the fabrication system, such as a localized dispensing apparatus. Examples of communication modules may include Ethernet cards, 802.11 WiFi devices, cellular data radios, and/or other suitable devices known in the art.

In an embodiment, the dispensing path control module 704 is contained in a system also including a localized dispensing apparatus, such as the system 300 described above with reference to FIG. 3. Thus, the dispensing plan control module 704 may provide for defining and/or otherwise controlling one or more variables as to how a chemical is provided onto a substrate. Thus, in an embodiment, the dispensing plan control module 704 defines a route of dispensing chemical onto a substrate (dispensing path) defined by the design and/or fabrication data. The route or dispensing path includes identifying certain portions of the substrate where chemical is desired, and providing certain portions of the substrate where chemical is not desired. As further example, the dispensing plan control module 704 may define, for example, determining and/or defining a temperature of a solvent, an angle of dispensing a chemical, a pump pressure, a dispense location(s), a chemical composition, and/or other suitable parameters.

Referring again to FIG. 6, the method 600 then proceeds to block 606 where the substrate is processed using a localized dispensing apparatus controlled according to the material removal plan determined in block 604. The substrate may be processed using a dispensing path identifying a path (or route) provided on the substrate where chemical is to be applied. In an embodiment, the system 300 is used to apply the chemical to the substrate. For example, the material removal plan is communicated to the system 300, which is programmable to provide for executing the plan.

In an embodiment, a stream of solvent is provided onto the substrate described above in block 602 according to the material removal plan. The stream of solvent may be applied by a localized dispensing apparatus substantially similar to as described above with reference to FIGS. 3, 4, and/or 5. The solvent may be operable to dissolve and/or otherwise remove material from the substrate. In an embodiment, the solvent is a solvent capable of stripping a photoresist material from the substrate. Exemplary solvents include, but are not limited to, acetone, NMP (1-methyl-2-pyrrolidon), DMSO (dimethyl sulfoxide), sulfolane, dimethylformadide (DFM), dimethylacetamide (DMAC), 2,(-2 aminoethoxy) ethanol, alkaline solutions, photoresist developer solutions, other amine-solvent mixtures, organic solvents, proprietary and commercially available stripping solutions such as, for example, Eastman Eastapure TM DE solvent (from Eastmann Chemical Company www.eastman.com), Posistrip (from DuPont, www.dupont.com), and/or other resist strippers now known or later developed. In an embodiment, block 606 includes providing a water rinse in substantially the same manner as described herein with respect to applying a chemical.

In summary, the methods and devices disclosed herein providing a chemical stream incident a substrate. The methods and devices provide for applying the chemical stream in a localized region. Embodiments of the methods and devices further allow for providing the chemical stream in controllable manner, such that the localized region of chemical stream is incident certain regions of a substrate, and not incident other regions of the substrate. In doing so, the present disclosure offers several advantages over prior art devices. Advantages of certain embodiments of the present disclosure include reducing the quantity of chemical use, reducing costs, efficiently performing material removal processes such as stripping photoresist, reducing the impact of other regions of the substrate from the material removal process, for example, by not providing incident chemical to those regions, improving control over the material removal process such as controlling parameters differently at one region of the substrate than the other, and/or other advantages.

Thus, in one of the broader embodiments discussed herein described is a method that includes providing a localized dispensing apparatus. A substrate having a material disposed on its top surface is oriented above the localized dispensing apparatus. A solvent is then dispensed from the localized dispensing apparatus onto the top surface of the oriented substrate. The solvent removes the material.

In a further embodiment, the localized dispensing apparatus includes a conduit (e.g., pipe) extending from a tank and the chemical is provided to the top surface via the conduit. In an embodiment, the chemical is heated in the localized dispensing apparatus. An angle of the dispensing of the chemical may be modified during and before the dispensing. The chemical may be dispensed from a plurality of nozzles of the localized dispensing apparatus.

In a further embodiment, the chemical is dispensed by dispensing solvent to a first region of the substrate; and dispensing solvent to a second region of the substrate. The solvent is not incident a third region of the substrate. The method may also include identifying a plurality of regions of the substrate having the material and then, dispensing the chemical only to the identified regions. The plurality of regions may be identified by using design data to determine a region having the material.

In another further embodiment, the material (e.g., photoresist) is formed on the substrate. A lithography process is then performed on the material to pattern the material prior to the orienting of the substrate. After dispensing the solvent, the dispensed solvent may be collected in a tank of the localized dispensing apparatus and then recycled for reuse.

In another of the broader forms of the embodiments discussed herein, a method is described that includes receiving data describing a pattern of material formed on a substrate. A path for removing the pattern of material using a localized dispensing apparatus is determined. The localized dispensing apparatus is then used to dispense solvent onto the substrate according to the determined path.

In a further embodiment of the method, receiving data describing the pattern of material includes receiving data identifying regions of a substrate having a photoresist feature. In an embodiment, defining the path includes identifying a region of the substrate having high aspect ratio features. In an embodiment, defining the path includes identifying a plurality of regions on the substrate disposed along different radial points on the substrate (e.g., at a different distance from a center point).

Systems for removing material from a substrate are also provided. In an embodiment, a system includes a support chuck (operable to hold a semiconductor wafer) and a localized dispensing apparatus. The localized dispensing apparatus includes a tank, a conduit, and a pump. The tank is operable to hold a solvent. The conduit extends substantially vertically from the tank. The pump for provides the solvent from the tank to the conduit.

In a further embodiment, a nozzle is disposed at the terminal end of the conduit. The nozzle defines a size, a shape, and an angle of the solvent dispensed. In an embodiment, the system further includes a controller module coupled to the localized dispensing apparatus. The controller module is operable to programmably control a dispensing location of the localized dispensing apparatus. The controller module may define the dispensing location by identifying a path on the semiconductor wafer along which the solvent is dispensed using the localized dispensing apparatus.

In a further embodiment, a plurality of nozzles is disposed on the conduit, each of the plurality of nozzles operable to deliver the solvent. In an embodiment, a plurality of conduits is disposed on the tank. The localized dispensing apparatus may also include a heater.

It is understood that different embodiments disclosed herein offer different disclosure, and that they may make various changes, substitutions and alterations herein without departing from the spirit and scope of the present disclosure.

What is claimed is:

1. A method, comprising:
   providing a localized dispensing apparatus, wherein the localized dispensing apparatus includes a conduit extending from a tank containing a solvent and a dispensing nozzle coupled to the conduit;
   orienting a substrate having a photosensitive material disposed on a top surface of the substrate above the localized dispensing apparatus;
   dispensing a solvent from the dispensing nozzle of the localized dispensing apparatus with positive pressure onto a portion of the top surface of the oriented substrate, wherein a distal tip of the dispensing nozzle is closer to a top surface level of the substrate than any other part of the localized dispensing apparatus, wherein the top surface level of the substrate is a level of a highest elevation of the substrate, wherein the solvent removes the photosensitive material;
   after dispensing the solvent, collecting the dispensed solvent in a tank of the localized dispensing apparatus disposed around a base of the dispensing nozzle; and
   recycling the collected solvent in the tank.

2. The method of claim 1, further comprising:
   heating the solvent in the localized dispensing apparatus.

3. The method of claim 1, wherein the dispensing the solvent further includes dispensing the solvent in an upward direction; and
   wherein the dispensed solvent is carried downward to the tank by gravity.

4. The method of claim 1, wherein the dispensing the solvent includes dispensing solvent from a plurality of nozzles of the localized dispensing apparatus.

5. The method of claim 1, wherein dispensing the solvent further includes:
   dispensing solvent to a first region of the substrate; and
   dispensing solvent to a second region of the substrate; and
   wherein the solvent is not incident a third region of the substrate.

6. The method of claim 1, further comprising:
   identifying a plurality of regions of the substrate having the photosensitive material; and
   dispensing the solvent only to the identified regions.

7. The method of claim 6, wherein the identifying the plurality of regions includes using design data to determine a region having the material.

8. The method of claim 1, further comprising:
   forming the photosensitive material on the substrate; and
   performing a lithography process on the material to pattern the material prior to the orienting of the substrate.

9. A method, comprising:
   receiving data describing a pattern of material formed on a substrate;
   defining a path for removing the pattern of material using a programmable, localized dispensing apparatus, wherein the localized dispensing apparatus includes a conduit extending from a tank containing a solvent and a dispensing nozzle coupled to the conduit;
   using the localized dispensing apparatus to dispense solvent from the dispensing nozzle of the localized dispensing apparatus with positive pressure onto a portion of the substrate according to the defined path, wherein a distal tip of the dispensing nozzle is closer to a top surface level of the substrate than any other part of the localized dispensing apparatus, wherein the top surface level of the substrate is a level of a highest elevation of the substrate;

after dispensing the solvent onto the substrate, collecting the dispensed solvent in a tank of the localized dispensing apparatus disposed around a base of the dispensing nozzle; and recycling the collected solvent in the tank.

10. The method of claim 9, wherein the receiving data describing the pattern of material includes receiving data identifying regions of a substrate having a photoresist feature.

11. The method of claim 9, wherein the dispensed solvent removes the pattern of material from the substrate.

12. The method of claim 9, wherein defining the path includes identifying a plurality of regions on the substrate disposed along different radial points on the substrate, and including the identified regions in the defined path.

13. A method comprising:

positioning a localized dispensing apparatus adjacent a substrate having a photosensitive material disposed thereon, wherein the localized dispensing apparatus includes a conduit extending from a tank containing a solvent and a dispensing nozzle coupled to the conduit;

determining a dispensing path along the substrate, wherein the dispensing path does not cover the entire substrate;

dispensing a solvent from the dispensing nozzle of the localized dispensing apparatus with positive pressure onto a portion of the substrate to remove the photosensitive material, wherein a distal tip of the dispensing nozzle is closer to a top surface level of the substrate than any other part of the localized dispensing apparatus, wherein the top surface level of the substrate is a level of a highest elevation of the substrate;

after dispensing the solvent from the localized dispensing apparatus onto the substrate, collecting the dispensed solvent in a tank of the localized dispensing apparatus disposed around a base of the dispensing nozzle; and recycling the collected solvent in the tank.

14. The method of claim 13, wherein the substrate has a first region and an adjacent second region, wherein the photosensitive material is disposed over the first region of the substrate and is absent from the second region of the substrate, and wherein the dispensing path traverses the first region of the substrate without traverses the second region of the substrate.

15. The method of claim 13, further comprising performing a cleaning process to the photosensitive material prior to dispensing the solvent from the dispensing nozzle of the localized dispensing apparatus onto the substrate to remove the photosensitive material.

16. The method of claim 13, further comprising positioning the localized dispensing apparatus under the substrate, wherein the photosensitive material faces the localized dispensing apparatus.

17. The method of claim 16, wherein the dispensing nozzle faces the photosensitive material when the localized dispensing apparatus is positioned under the substrate.

18. The method of claim 13, further comprising heating the solvent.

19. The method of claim 13, wherein dispensing the solvent from the dispensing nozzle of the localized dispensing apparatus onto the substrate to remove the photosensitive material includes:

dispensing the solvent from the localized dispensing apparatus at a first positive pressure to a first region of the substrate, and dispensing the solvent from the localized dispensing apparatus at a second positive pressure to a second region of the substrate, wherein the second positive pressure is different than the first positive pressure.

20. The method of claim 13, further comprising heating the solvent in the conduit of the localized dispensing apparatus.

* * * * *